United States Patent
Yamada

(10) Patent No.: US 9,894,777 B2
(45) Date of Patent: Feb. 13, 2018

(54) ACF STICKING METHOD AND ACF STICKING APPARATUS

(71) Applicant: Panasonic Intellectual Property Management Co., Ltd., Osaka (JP)

(72) Inventor: Shingo Yamada, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 134 days.

(21) Appl. No.: 14/995,700

(22) Filed: Jan. 14, 2016

(65) Prior Publication Data

US 2016/0257106 A1    Sep. 8, 2016

(30) Foreign Application Priority Data

Mar. 6, 2015 (JP) .................... 2015-044150
Mar. 6, 2015 (JP) .................... 2015-044151

(51) Int. Cl.

| | |
|---|---|
| *B29C 65/02* | (2006.01) |
| *B29C 65/48* | (2006.01) |
| *B29C 65/50* | (2006.01) |
| *B32B 37/12* | (2006.01) |
| *B32B 37/26* | (2006.01) |
| *B32B 38/10* | (2006.01) |
| *B32B 39/00* | (2006.01) |
| *B32B 43/00* | (2006.01) |
| *H05K 3/36* | (2006.01) |

(Continued)

(52) U.S. Cl.
CPC .......... *H05K 3/361* (2013.01); *B32B 37/0046* (2013.01); *B32B 2457/202* (2013.01); *H05K 3/323* (2013.01); *H05K 2201/10136* (2013.01); *H05K 2203/0191* (2013.01); *H05K 2203/0264* (2013.01)

(58) Field of Classification Search
USPC ....... 156/230, 231, 238, 247, 249, 250, 256, 156/289, 499, 510, 517, 537, 538, 540
See application file for complete search history.

(56) References Cited

FOREIGN PATENT DOCUMENTS

| | | | |
|---|---|---|---|
| JP | 07101618 A | * | 4/1995 |
| JP | 2007-088128 A | | 4/2007 |
| JP | 2009049238 A | * | 3/2009 |

OTHER PUBLICATIONS

English Abstract of JP07-101618 (Jul. 18, 2017).*

(Continued)

*Primary Examiner* — Sing P Chan
(74) *Attorney, Agent, or Firm* — Pearne & Gordon LLP

(57) ABSTRACT

An Anisotropic Conductive Film (ACF) is stuck to a substrate by: under-receiving the substrate on which a film-shaped component is mounted by a under-receiving section, increasing an interval between a sticking head and the under-receiving section in the under-receiving step; transporting a tape member in which a base tape is bonded to the ACF and causing a sticking surface of the ACF to face the substrate, pressing the ACF together with the base tape on the substrate and sticking the ACF to the substrate, peeling the ACF sticking to the substrate from the base tape by moving a peeling member in a horizontal direction by causing the peeling member to be interposed between the ACF and the base tape, and regulating an upward warpage deformation of the component during peeling the ACF from the base tape by moving the peeling member.

4 Claims, 18 Drawing Sheets

(51) Int. Cl.
*B32B 37/00*       (2006.01)
*H05K 3/32*        (2006.01)

(56)          References Cited

OTHER PUBLICATIONS

English Abstract of JP 2009-049238 (Jul. 18, 2017).*
Machine translation of JP 07-101618 (7/18/207).*
Machine translation of JP 2009-049238 (Jul. 18, 2017).*

* cited by examiner

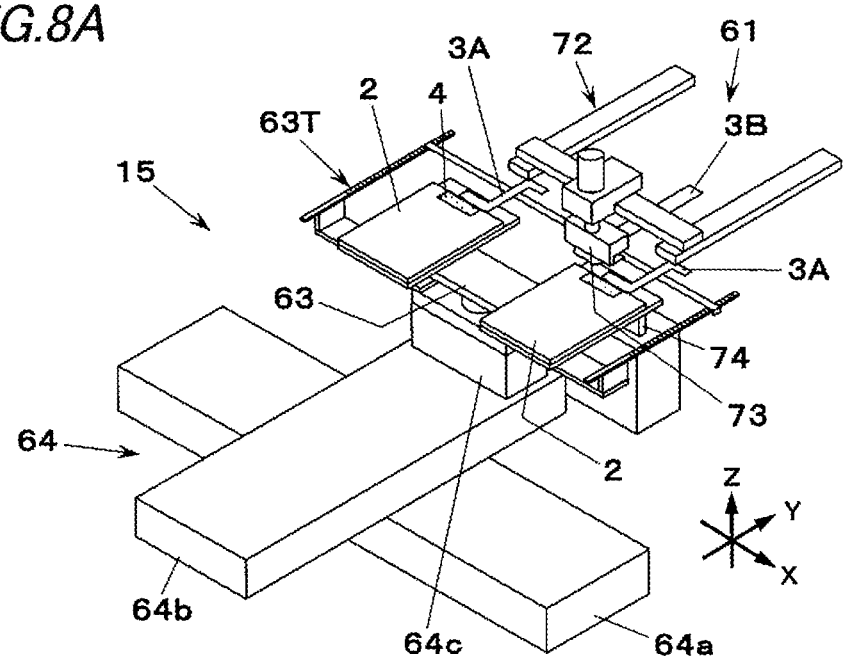
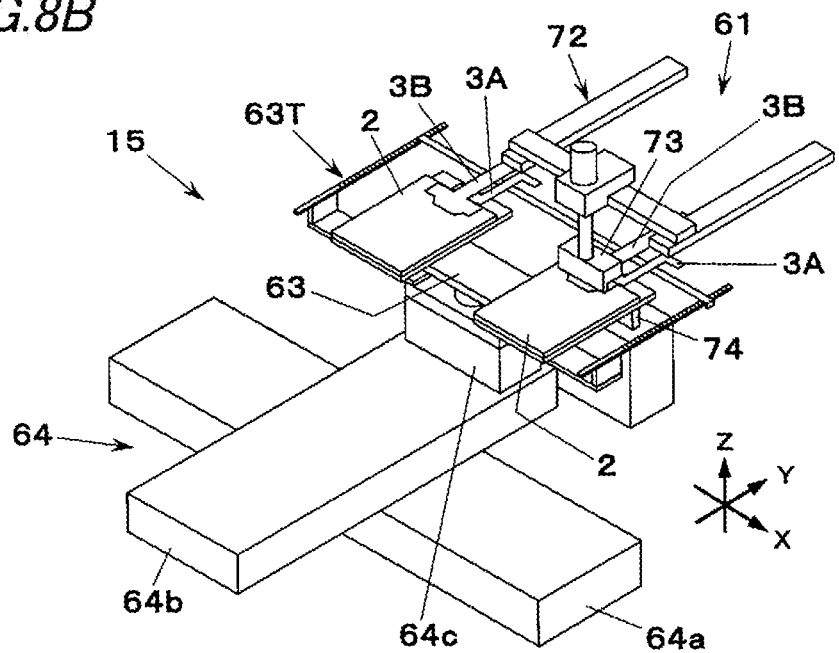

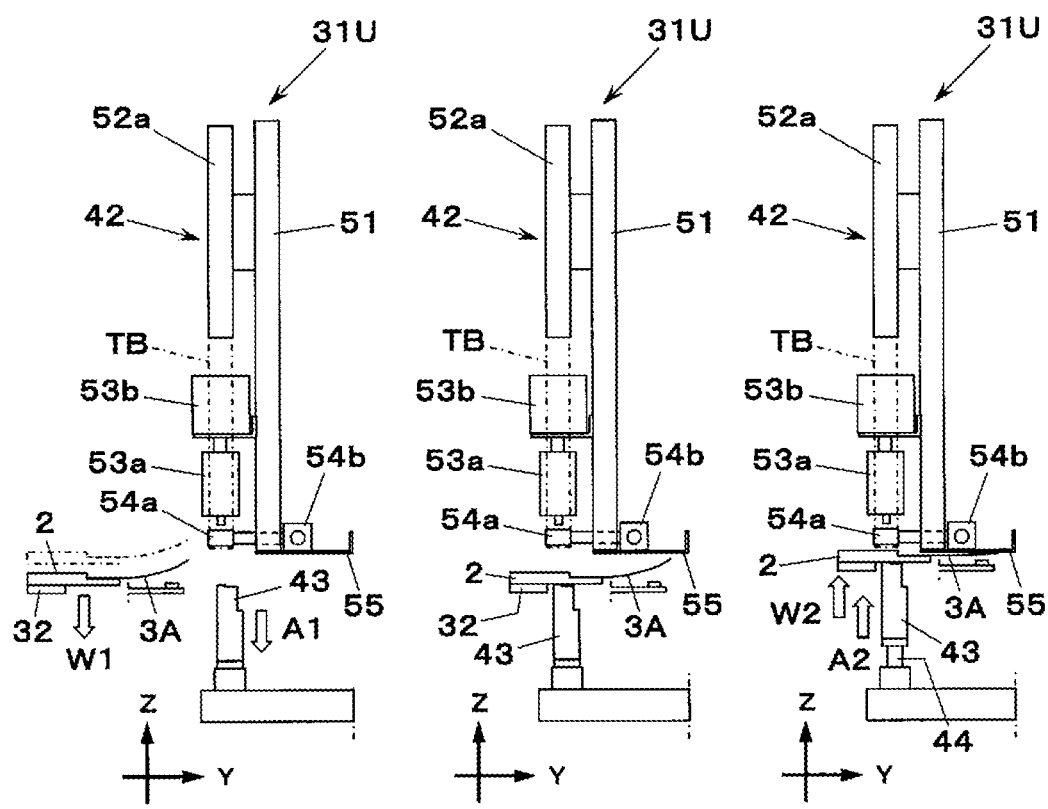

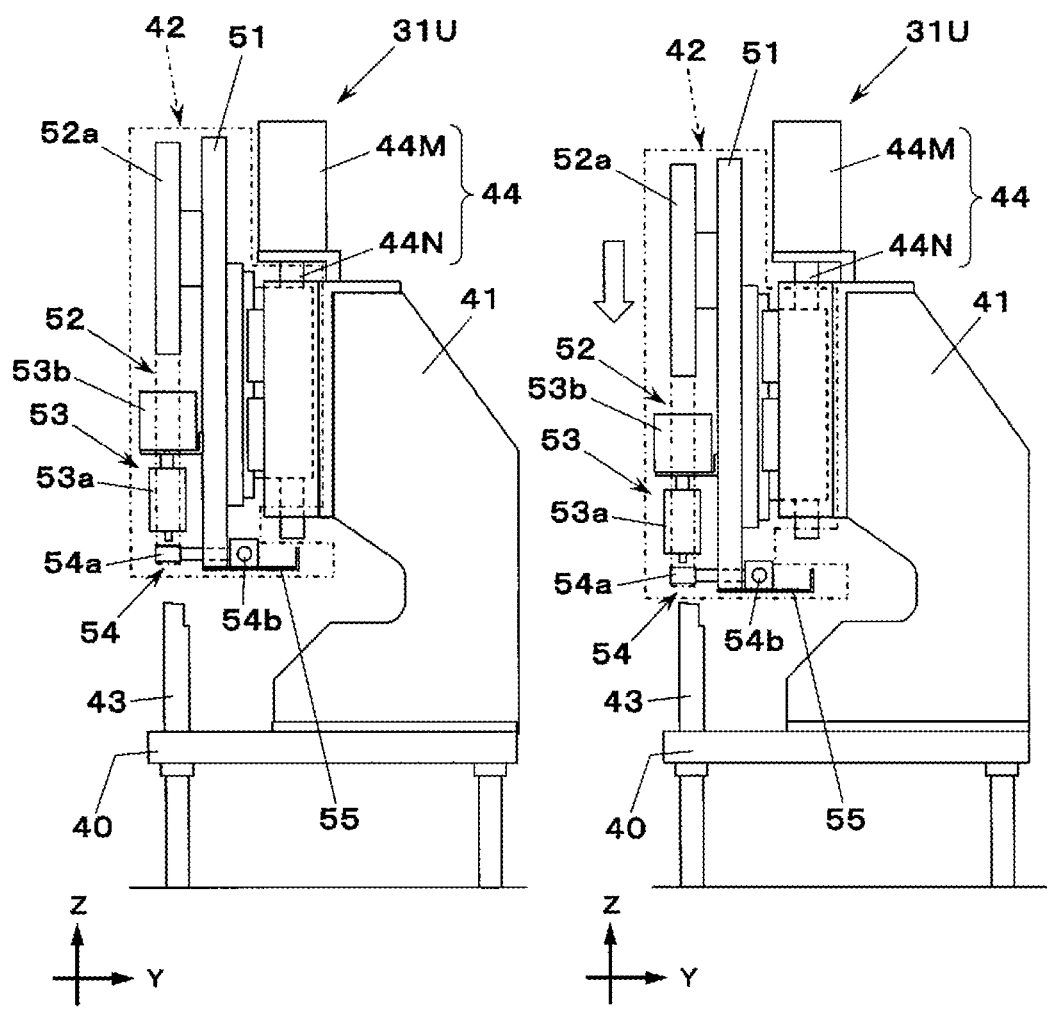

ACF STICKING METHOD AND ACF STICKING APPARATUS

CROSS-REFERENCES TO RELATED APPLICATION(S)

This application is based on and claims priority from Japanese Patent Application Nos. 2015-044150 filed on Mar. 6, 2015 and 2015-044151 filed on Mar. 6, 2015, the entire contents of which are incorporated herein by reference.

BACKGROUND

1. Field of the Invention

The present invention relates to an anisotropic conductive film (ACF) sticking method and an ACF sticking apparatus for sticking an ACF as an adhesive member attaching a film-shaped component such as a flexible substrate on a substrate such as a liquid crystal panel.

2. Description of Related Art

In a related art, an ACF sticking apparatus that sticks an anisotropic conductive film (ACF) on a substrate includes a under-receiving section that under-receives the substrate and a sticking head that is positioned above the under-receiving section and sticks the ACF on the substrate under-received on the under-receiving section. The sticking head is configured such that a tape member that is obtained by bonding a base tape to the ACF is transported by a tape transporting section, a sticking surface of the ACF to the substrate faces the substrate that is under-received in the under-receiving section, and then the ACF is pressed to the substrate for each base tape by a pressing tool. Then, a peeling member is interposed between the ACF and the base tape and moved in a horizontal direction, and then the ACF stuck to the substrate is peeled from the base tape.

In the ACF sticking apparatus, a film-shaped component such as the flexible substrate is mounted and pressed on the substrate to which the ACF is stuck in a device (component pressing device) on a downstream process side. In the substrates, there is a multi-layer type substrate that is formed of a plurality of layers. In order to manufacture such a multi-layer type substrate, an ACF sticking apparatus that sticks the ACF for mounting a second components on an upper layer side of the substrate on which a first component is mounted is necessary on a downstream process side in addition to the ACF sticking apparatus on the upstream process side on which the ACF is stuck for mounting the first component on a lower layer side of the substrate (for example, JP-A-2007-088128).

However, in the ACF sticking apparatus on the downstream process side, it is necessary to under-receive (support) the substrate on which the film-shaped component is already mounted by the under-receiving member. If warpage deformation occurs upwardly in the component, the component may not be able to pass between the sticking head and the under-receiving section during under-receiving the substrate on the under-receiving section, or the moved peeling member may interfere with the component during peeling the ACF, an operation does not process smoothly, and thereby there is a problem that workability may be lowered.

SUMMARY

One or more embodiments provide an ACF sticking method and an ACF sticking apparatus in which workability is not lowered even if warpage deformation occurs in a film-shaped component that is already mounted on a substrate.

BRIEF DESCRIPTION OF THE DRAWINGS

FIGS. 8A and 8B are perspective views of the component mounting section included in the component mounting apparatus in the embodiment.

FIGS. 11A to 11C are explanatory views of an operation during a sticking operation of an ACF by the ACF sticking section included in the component mounting apparatus in the embodiment.

FIGS. 17A and 17B are side views of the ACF sticking section included in the component mounting apparatus in the modified embodiment.

DETAILED DESCRIPTION

Figure 1:
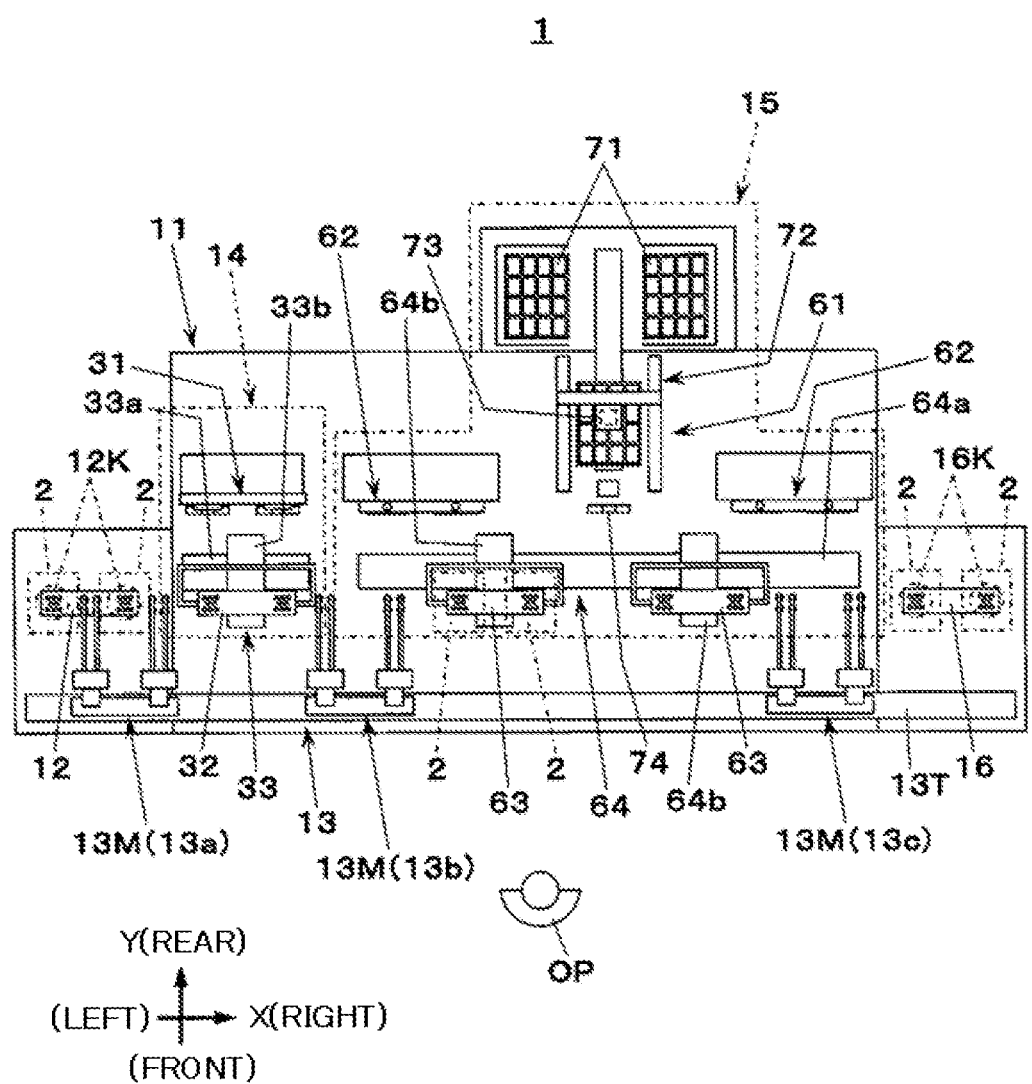
FIG. 1 is a plan view of a component mounting apparatus in an embodiment.
Figure 2:
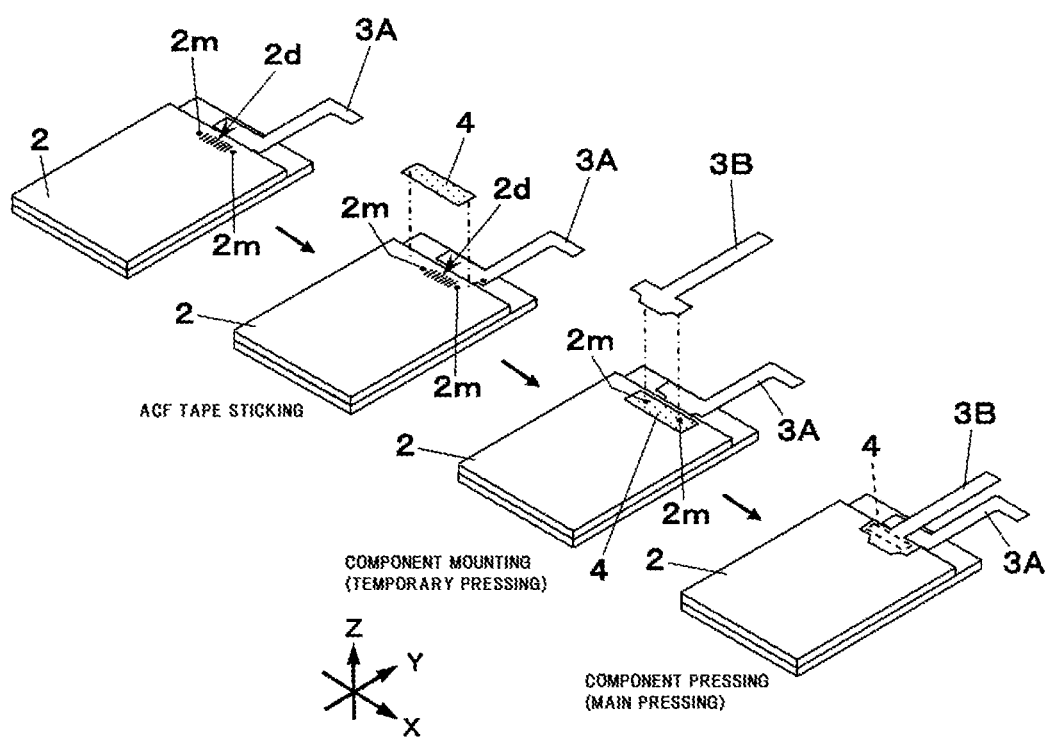
FIG. 2 is a view illustrating processing steps of a component mounting operation with respect to a substrate by the component mounting apparatus in the embodiment.

An embodiment will be described with reference to the drawings. A component mounting apparatus 1 illustrated in FIG. 1 is provided for further mounting a separate film-shaped component (referred to as a second mounting component 3B; FIG. 2) on a substrate 2 on which a film-shaped component (referred to as a first mounting component 3A; FIG. 2) is already mounted in manufacturing of a liquid crystal panel substrate and the like. The substrate 2 has two layers of a lower layer and an upper layer.

The first mounting component 3A is mounted on the substrate 2 on a lower layer side and the second mounting component 3B is mounted on the substrate 2 on an upper layer side. Mounting of the second mounting component 3B is performed by sticking an ACF 4 as an adhesive member to an electrode section 2d provided in the substrate 2 on the upper layer side, mounting and pressing the second mounting component 3B on and to the ACF 4. In the embodiment, mounting and pressing of a film-shaped component collectively refer to as "mounting of component". Moreover, the first mounting component 3A mounted on the substrate 2 is not necessarily limited to a flat shape and the upward warpage deformation may occur in the first mounting component 3A by a shape and a material of the first mounting component 3A, a situation when sticking the first mounting component 3A to the substrate 2, and the like.

In FIG. 1, a carrying-in stage 12, a substrate transfer section 13, an ACF sticking section 14, a component mounting section 15, and a carrying-out stage 16 are provided on a base stand 11 of the component mounting apparatus 1. In the embodiment, a front side of the component mounting apparatus 1 is referred to as a front side of the component mounting apparatus 1 when viewed from an operator OP and an inner side of the component mounting apparatus 1 is referred to as a rear side of the component mounting apparatus 1 when viewed from the operator OP. In addition, a left side of the component mounting apparatus 1 is referred to as a left side of the component mounting apparatus 1 when viewed from the operator OP and a right side of the component mounting apparatus 1 is referred to as a right side of the component mounting apparatus 1 when viewed from the operator OP. Furthermore, a right and left direction is referred to as an X axis direction, a front and rear direction is referred to as a Y axis direction, and an up and down direction of the component mounting apparatus 1 is referred to as a Z axis direction.

In FIG. 1, the carrying-in stage 12 is provided in a left end portion of the base stand 11. The carrying-in stage 12 has carrying-in stage suction ports 12K that are open to an upper surface in both end portions in the X axis direction. The carrying-in stage 12 sucks and holds one or two substrates 2 carried in from another device on an upstream process side by a substrate carrying-in unit (not illustrated) in the carrying-in stage suction ports 12K.

Figure 3:
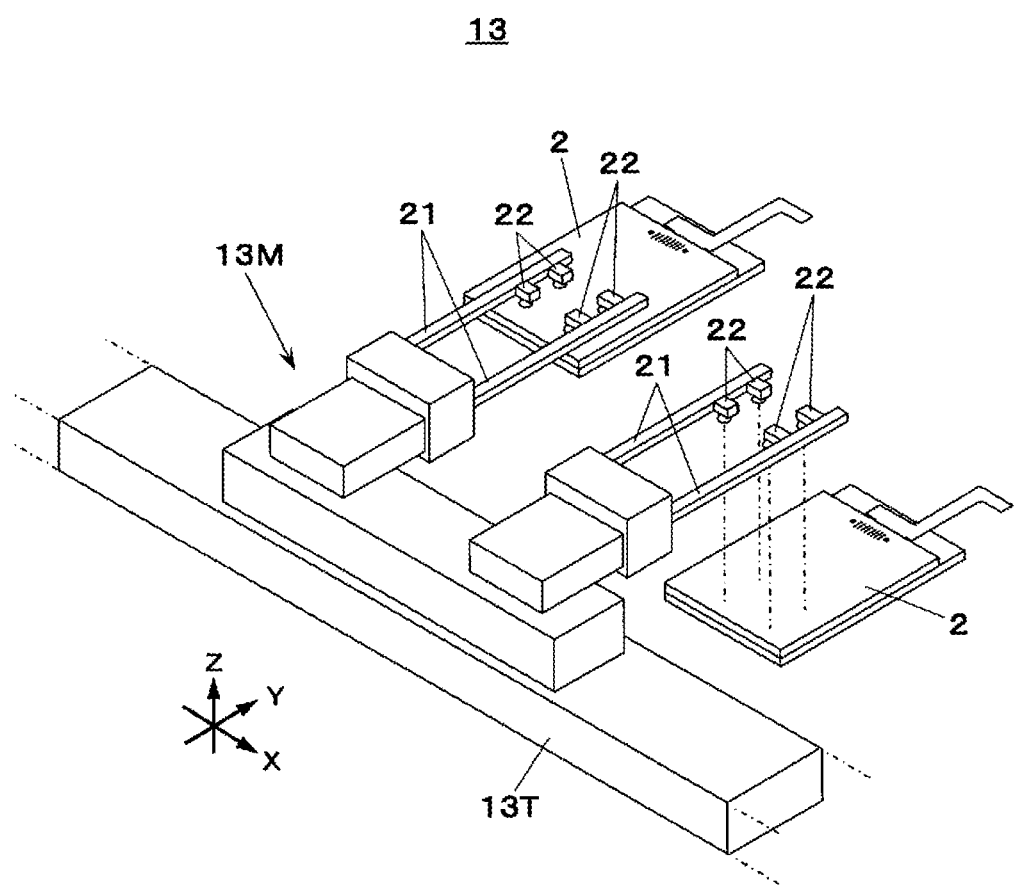
FIG. 3 is a perspective view of a substrate transporter included in the component mounting apparatus in the embodiment.

In FIG. 1, the substrate transfer section 13 is configured of a transfer member moving table 13T that is provided to extend in the X axis direction in a foremost region of the base stand 11 and three substrate transfer members 13M that is provided on the transfer member moving table 13T to be movable in the X axis direction. The three substrate transfer members 13M refer to as a left transfer member 13a, a center transfer member 13b, and a right transfer member 13c in this order from the left side. In FIG. 3, each substrate transfer member 13M has a plurality of suction arms 21 extending rearward and a plurality of suction sections 22 of which suction ports face downward are provided in each suction arm 21.

Each substrate transfer member 13M sucks (picks up) the substrate 2 from the upper side by the suction section 22, is driven by the transfer member moving table 13T, and transfers the substrate 2 by moving in the X axis direction. Here, a case where each substrate transfer member 13M sucks simultaneously two substrates 2 is illustrated, but each substrate transfer member 13M can suck one substrate 2 having a large size.

In FIG. 1, the ACF sticking section 14 is provided in a right region of the carrying-in stage 12 and includes an ACF sticking mechanism 31, a sticking stage 32, and a sticking stage moving mechanism 33. The ACF sticking section 14 functions as an ACF sticking device for sticking the ACF 4 to the substrate 2.

Figure 4A:
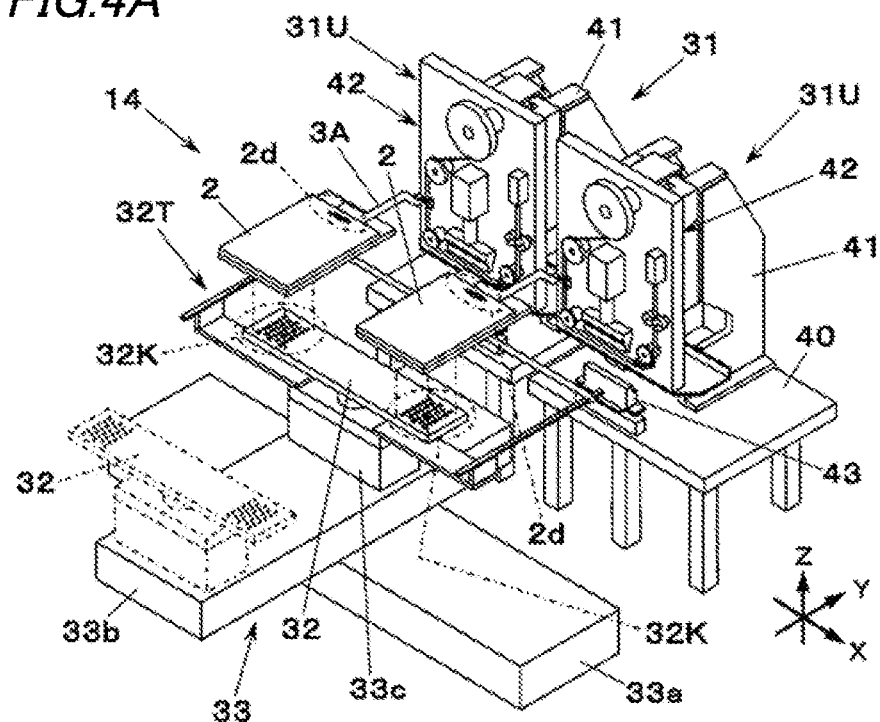
FIGS. 4A and 4B are perspective views of an ACF sticking section included in the component mounting apparatus in the embodiment.
Figure 4B:
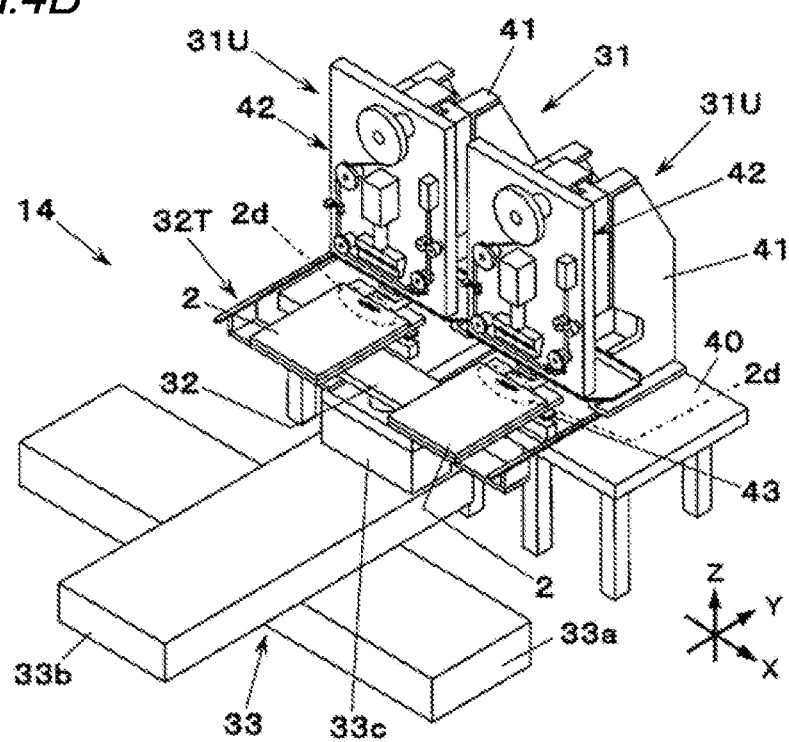
Figure 5:
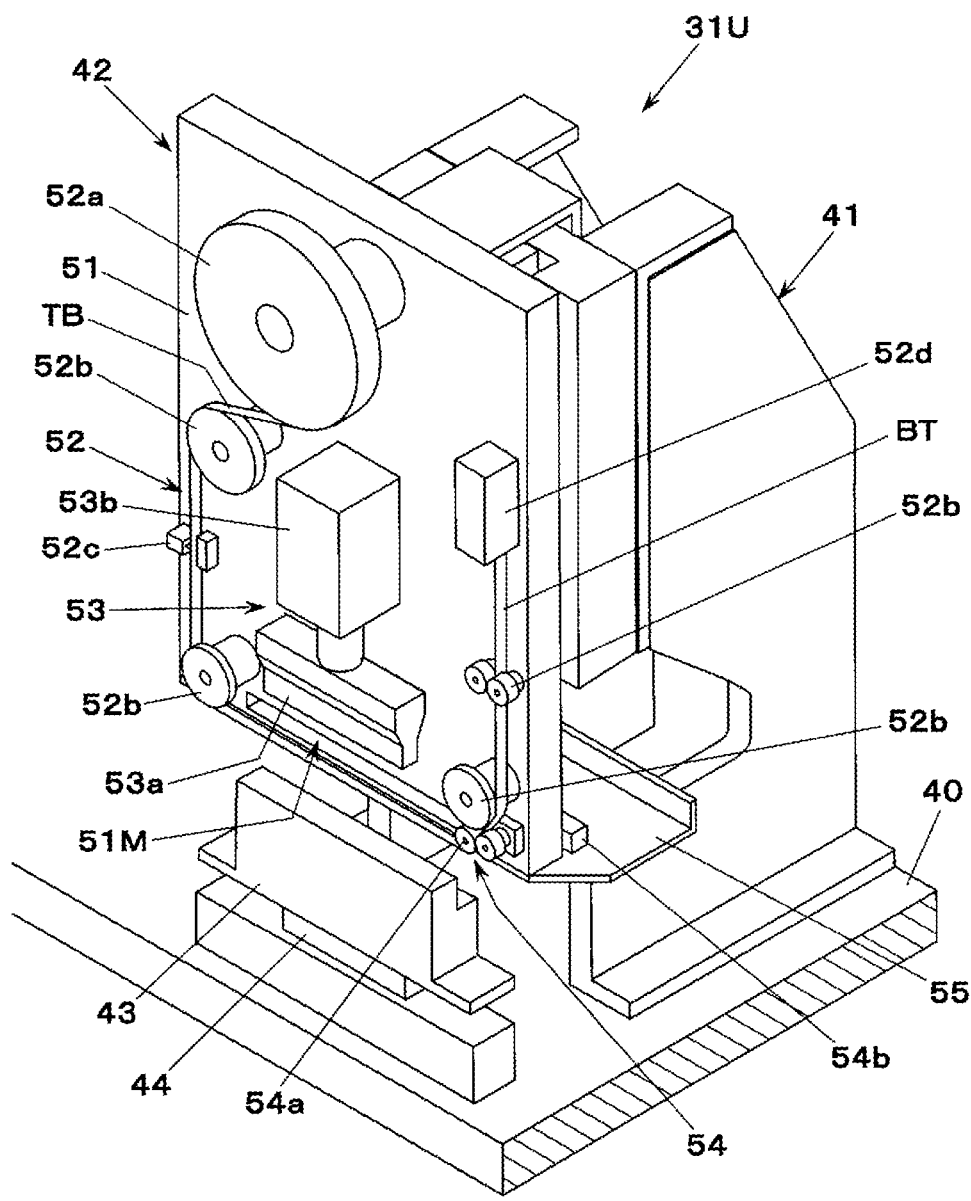
FIG. 5 is a partial perspective view of the ACF sticking section included in the component mounting apparatus in the embodiment.

In FIGS. 4A and 4B, the ACF sticking mechanism 31 has two ACF sticking units 31U provided side by side in the X axis direction. As illustrated in FIGS. 4A, 4B, and 5, each ACF sticking unit 31U includes a table section 40, a head support section 41 provided in the table section 40, a sticking head 42 mounted on the head support section 41, and a sticking support stand 43 (under-receiving section) provided in the table section 40. The sticking support stand 43 is attached to the table section 40 through an actuator 44 as a under-receiving section lifting unit. In the present embodiment, the actuator 44 is configured by, for example, a power cylinder and so on (refer FIGS. 5, 6A and 6B). The under-receiving section lifting unit may be any means that can lift the sticking support stand 43. The under-receiving section lifting unit may configured by, for example, a ball screw threadably mounted on a screw thread and a motor for rotatably driving the ball screw.

Figure 6A:
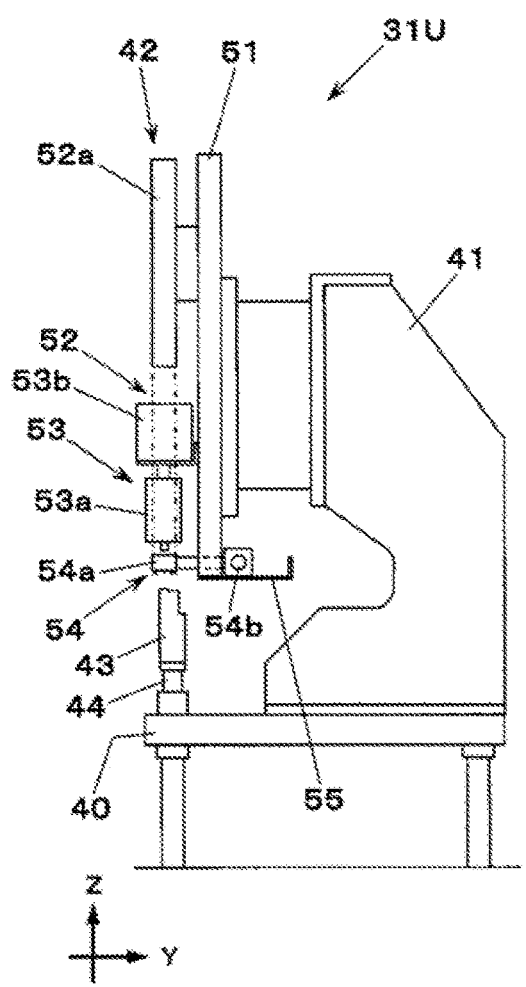
FIGS. 6A and 6B are side views of the ACF sticking section included in the component mounting apparatus in the embodiment.
Figure 6B:
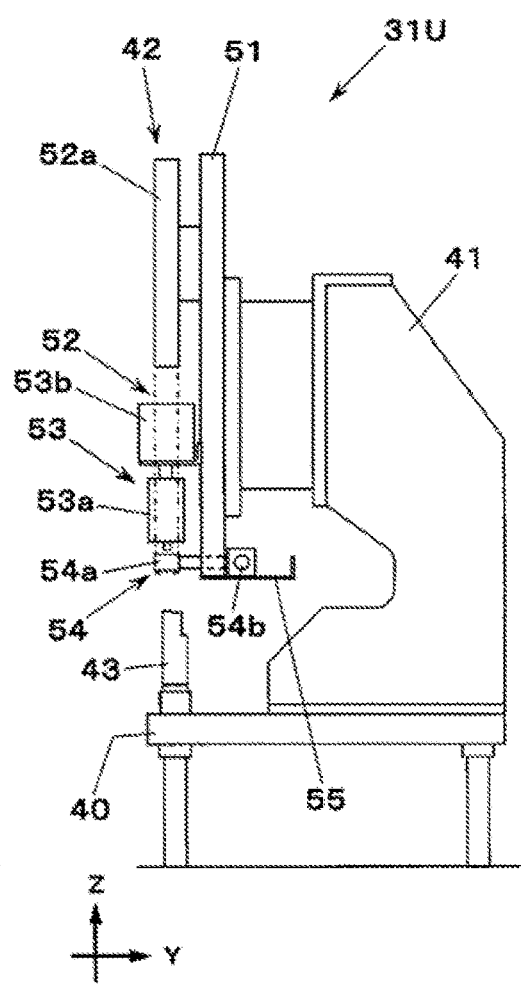

In FIGS. 5, 6A, and 6B, the sticking head 42 includes a table transport section 52, a pressing section 53, a peeling section 54, and a plate member 55 on a base plate 51. The tape transport section 52 is configured of a tape supply reel 52a, a plurality of roller members 52b, a cutter section 52c, and a recovery section 52d. The tape supply reel 52a feeds and supplies a tape member TB that is obtained by bonding a base tape BT to the tape-shaped ACF 4. The plurality of the roller members 52b guide and transport the tape member TB supplied by the tape supply reel 52a. The cutter section 52c cuts the tape-shaped ACF 4 on the base tape BT by providing notches at predetermined intervals. The recovery section 52d sucks and recovers the base tape BT after the cut ACF 4 is separated.

In FIGS. 5, 6A, and 6B, the pressing section 53 is configured of a pressing tool 53a and a tool lifting cylinder 53b for lifting and lowering the pressing tool 53a. The peeling section 54 includes a peeling member 54a with which the tape member TB (specifically, the base tape BT) transported by the tape transport section 52 is interposed between a pair of rollers and a peeling cylinder 54b that moves the peeling member 54a along a moving groove 51M provided in a lower portion of the base plate 51 in the X axis direction. The actuator 44 extends and shrinks to move the sticking support stand 43 up and down with respect to the base stand 11. FIG. 6A shows a condition in which the sticking support stand 43 positions in a normal position (that is an initial position). FIG. 6B shows a condition in which the sticking support stand 43 is lowered from the initial position. The plate member 55 is mounted on a lower end of the base plate 51. The plate member 55 extends rearward the base plate 51.

In FIG. 4A, the sticking stage 32 has sticking stage suction ports 32K that are opened to the upper surface in both end portions in the X axis direction. The sticking stage 32 sucks and holds a lower surface of the substrate 2 transferred by the left transfer member 13a from the carrying-in stage 12 in the sticking stage suction port 32K.

In FIG. 1, the sticking stage moving mechanism 33 is provided in the front region of the ACF sticking mechanism 31. As illustrated in FIGS. 4A and 4B, the sticking stage moving mechanism 33 is configured of a sticking stage lower table 33a that is provided to extend in the X axis direction, a sticking stage upper table 33b that is provided on the sticking stage lower table 33a to extend in the Y axis direction, and a lifting table 33c that is provided in the sticking stage upper table 33b. The sticking stage 32 is provided in the lifting table 33c.

The sticking stage lower table 33a moves the sticking stage upper table 33b in the X axis direction, the sticking stage upper table 33b moves the sticking stage 32 in the Y axis direction, and thereby the sticking stage 32 moves in an XY plane. In addition, the lifting table 33c is operated and thereby the sticking stage 32 lifts and lowers. As described above, in the embodiment, the sticking stage 32 has a configuration to be moved by the sticking stage moving mechanism 33 in the direction in the horizontal plane and the up and down direction.

The sticking stage 32 performs receipt and delivery of the substrate 2 in a predetermined position (position indicated by a solid line in FIG. 4A; referred to as a substrate transfer position) that is moved from the foremost position (position indicated by an one-dotted chain line in FIG. 4A; referred to as a standby position) on the sticking stage upper table 33b rearward. The sticking stage 32 is moved from the substrate transfer position to the rearmost position (position illustrated in FIG. 4B; referred to as an operation position) on the sticking stage upper table 33b in the front region of the ACF sticking mechanism 31 thereby causing the held substrate 2 to be positioned in an "ACF sticking position". Here, the "ACF sticking position" is a position in which the electrode section 2d of the substrate 2 is positioned above the sticking support stand 43 and then the ACF sticking mechanism 31 can perform the sticking operation of the ACF 4 to the substrate 2.

As illustrated in FIGS. 4A and 4B, a component support 32T is provided in the sticking stage 32 to extend rearward. The component support 32T supports a protruding portion of the first mounting component 3A that is protruded from a rear portion of the substrate 2, which is already mounted on the substrate 2, from below.

In FIG. 1, the component mounting section 15 is provided in a right region of the ACF sticking section 14 and includes a component mounting mechanism 61, two component pressing mechanisms 62, two mounting stages 63, and a mounting stage moving mechanism 64. The component mounting section 15 functions as a component mounting device for mounting (mounting and pressing) the second mounting component 3B on the substrate 2 to which the ACF 4 is stuck.

Figure 7A:
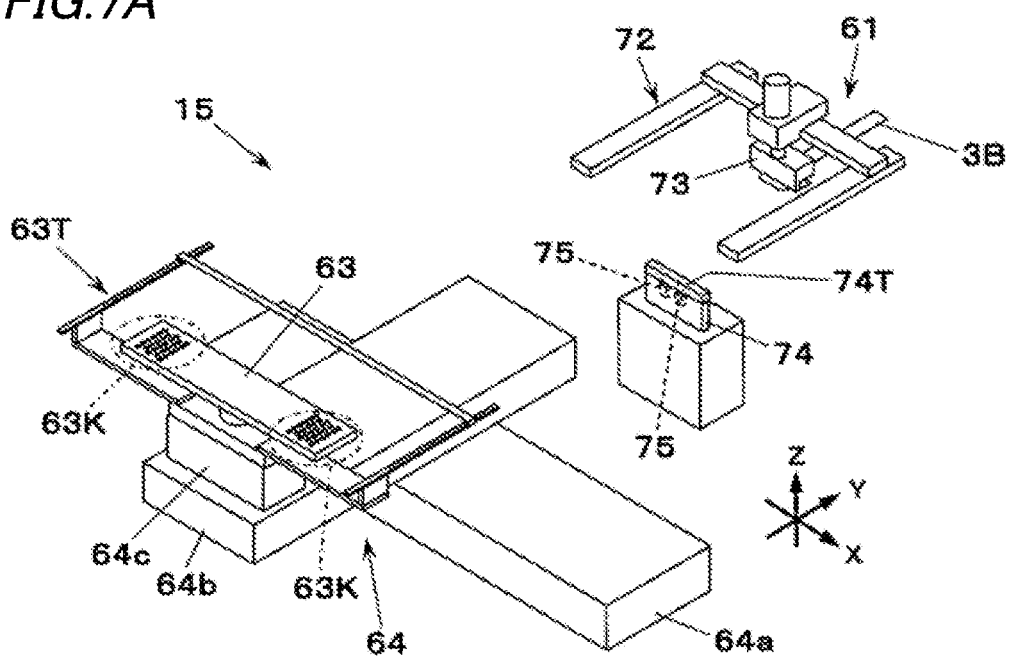
FIGS. 7A and 7B are perspective views of a component mounting section included in the component mounting apparatus in the embodiment.

As illustrated in FIGS. 1, 7A, 7B, 8A, and 8B, the component mounting mechanism 61 includes a component supply section 71 that supplies the second mounting component 3B, a mounting head moving mechanism 72, a mounting head 73 that is moved in the horizontal plane by the mounting head moving mechanism 72, and a mounting support stand 74 that is provided below the mounting head 73. In FIG. 7A, two recognition cameras 75, of which imaging fields face upward, are provided in the mounting support stand 74 side by side in the X axis direction. The two recognition cameras 75 perform imaging through a transparent material section 74T such as quartz glass provided in an upper portion of the mounting support stand 74.

Figure 9A:
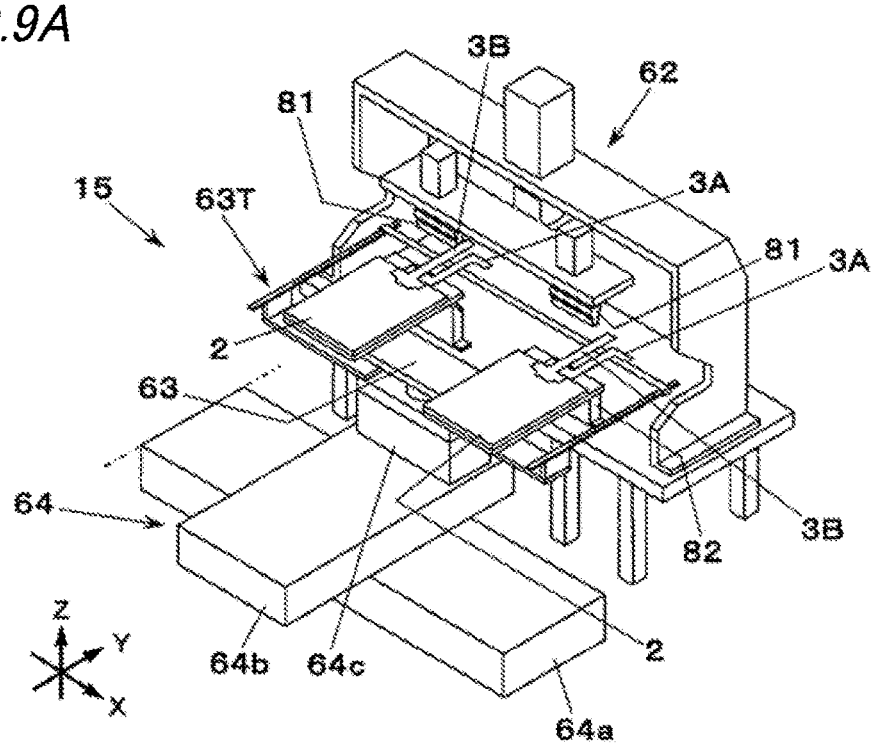
FIGS. 9A and 9B are perspective views of the component mounting section included in the component mounting apparatus in the embodiment.
Figure 9B:
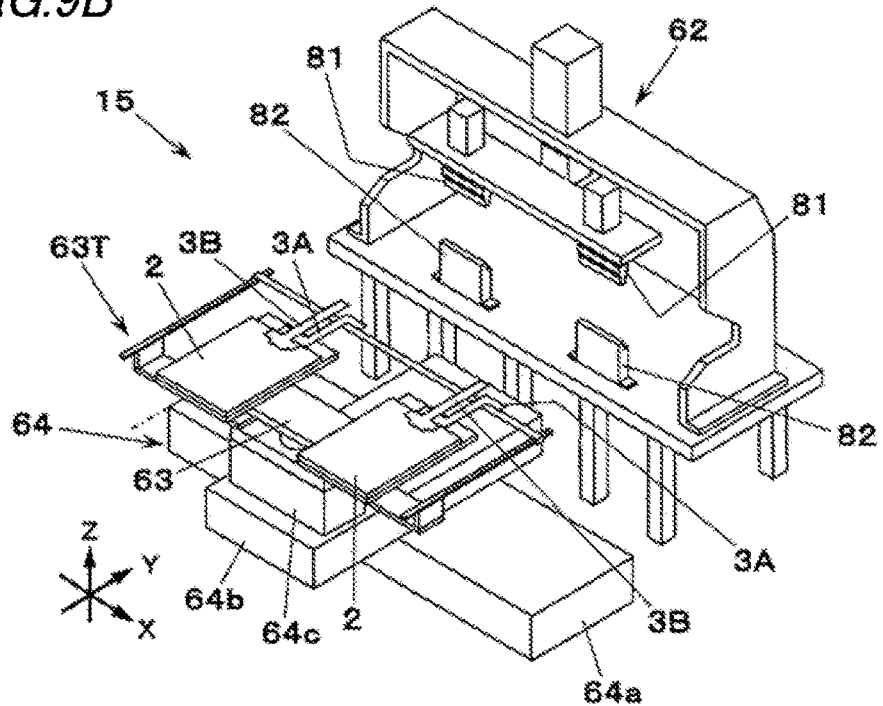

In FIG. 1, the two component pressing mechanisms 62 are provided in positions in which the component mounting mechanism 61 is interposed therebetween from both right and left both ends. In FIGS. 9A and 9B, each component pressing mechanism 62 includes two pressing heads 81 that are provided side by side in the X axis direction and two pressing support stands 82 that are provided below each pressing head 81.

Figure 7B:
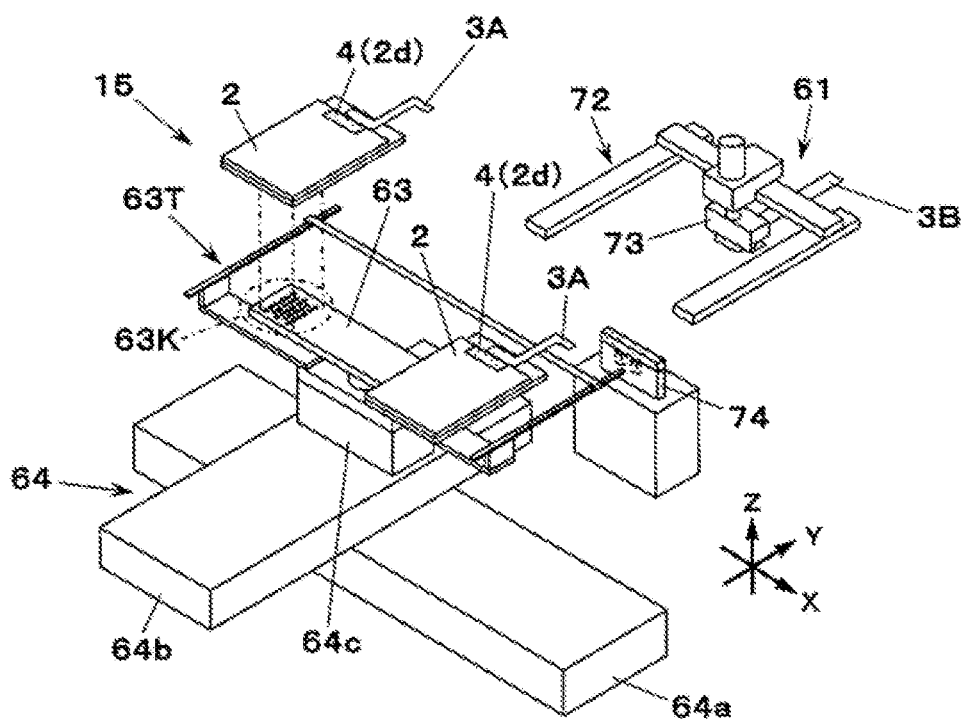

In FIGS. 7A and 7B, the mounting stage 63 has mounting stage suction ports 63K that are opened to the upper surface in both end portions in the X axis direction. The mounting stage 63 sucks and holds the lower surface of the substrate 2 transferred by the center transfer member 13b from the sticking stage 32 in the mounting stage suction ports 63K.

In FIG. 1, the mounting stage moving mechanism 64 is provided over the front region of the component mounting mechanism 61 and the front region of the two component pressing mechanisms 62. As illustrated in FIGS. 7A and 7B, the mounting stage moving mechanism 64 is configured of a mounting stage lower table 64a that is provided to extend in the X axis direction, two mounting stage upper tables 64b that are provided on the mounting stage lower table 64a to extend in the Y axis direction, and a lifting table 64c that is provided in the mounting stage upper tables 64b. The two mounting stages 63 are provided in two lifting tables 64c.

The mounting stage lower table 64a moves the mounting stage upper tables 64b in the X axis direction, the mounting stage upper tables 64b move the mounting stage 63 in the Y axis direction, and thereby the mounting stage 63 is moved in the XY plane. In addition, the lifting table 64c is operated and thereby the mounting stage 63 is lifted and lowered. As described above, in the embodiment, the mounting stage 63 is configured to be moved in the direction in the horizontal plane and the up and down direction by the mounting stage moving mechanism 64.

The mounting stage 63 performs receipt and delivery of the substrate 2 in a predetermined position (position illustrated in FIG. 7B; referred to as the substrate transfer position) that is moved rearward from the foremost position (position illustrated in FIG. 7A; referred to as the standby position) on the mounting stage upper table 64b. The mounting stage 63 positions the held substrate 2 in a "component mounting position" by moving from the substrate transfer position to the rearmost position (position illustrated in FIG. 8A; referred to as the operation position) on the mounting stage upper table 64b in the front region of the component mounting mechanism 61. Here, the "component mounting position" is a position in which the electrode section 2d of the substrate 2 is positioned above the mounting support stand 74 and the component mounting mechanism 61 can perform the mounting operation of the second mounting component 3B on the substrate 2.

In addition, the mounting stage 63 that is positioned in the operation position moves from the front region of the component mounting mechanism 61 to the front region of the component pressing mechanism 62 in the X axis direction and thereby position the substrate 2 in the component mounting position in a "component pressing position" (FIGS. 9A and 9B). Here, the "component pressing position" is a position in which the electrode section 2d of the substrate 2 is positioned above the pressing support stand 82 and the component pressing mechanism 62 can perform a pressing operation of the second mounting component 3B to the substrate 2.

As described above, in the embodiment, the sticking stage 32 is the substrate holding section for holding the substrate 2 on which the first mounting component 3A is already mounted. In addition, the sticking stage moving mechanism 33 is the substrate moving section which moves the sticking stage 32 and by which the substrate 2 held by the sticking stage 32 is under-received in the sticking support stand 43.

As illustrated in FIGS. 7A, 7B, 8A, 8B, 9A, and 9B, a component support 63T is provided in the mounting stage 63 to extend rearward. The component support 63T supports the protruding portion of the first mounting component 3A that has already been mounted on the substrate 2 protruding from the rear portion of the substrate 2 and a portion of the second mounting component 3B that is newly mounted on the substrate 2 protruding from the rear portion of the substrate 2 from below.

In FIG. 1, the carrying-out stage 16 is provided in a right region (right end portion of the base stand 11) of the component mounting section 15. The carrying-out stage 16 has carrying-out stage suction ports 16K that are open to an upper surface in both end portions in the X axis direction. The carrying-out stage 16 sucks and holds the lower surface of the substrate 2 that is transferred from the mounting stage 63 by the right transfer member 13c in the carrying-out stage suction ports 16K.

Figure 10:
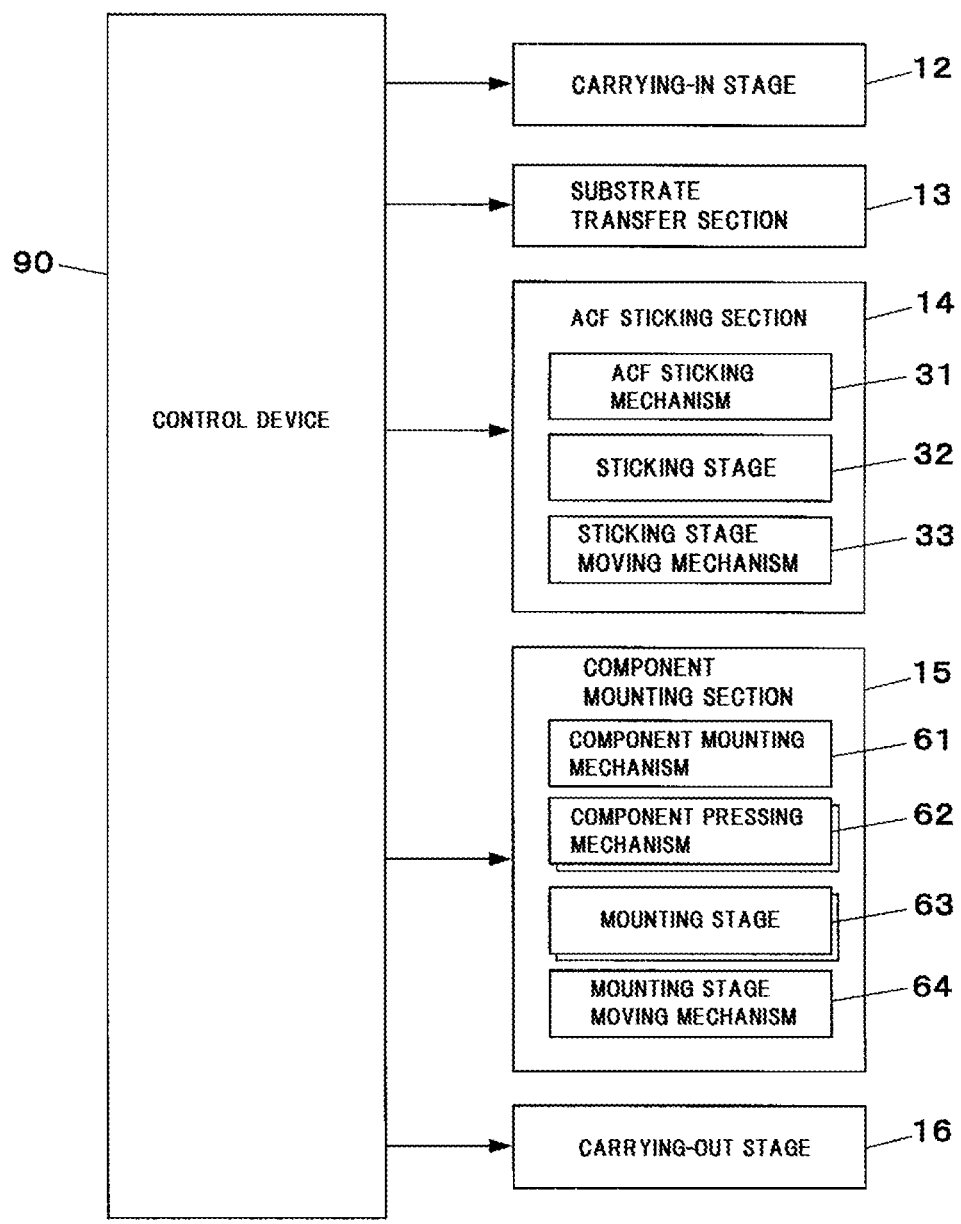
FIG. 10 is a block diagram illustrating a control system of the component mounting apparatus in the embodiment.

A control device 90 provided on an inside of the base stand 11 performs control of each operation such as a suction control of the substrate 2 by the carrying-in stage 12, a transfer control of the substrate 2 by the substrate transfer section 13, a sticking control of the ACF 4 to the substrate 2 by the ACF sticking section 14, a mounting control of the second mounting component 3B on the substrate 2 by the component mounting section 15, and a suction control of the substrate 2 by the carrying-out stage 16 (FIG. 10).

Next, an operation (component mounting method) of the component mounting apparatus 1 will be described. In FIG. 1, if the substrate 2 is carried in from the outside to the carrying-in stage 12, the left transfer member 13a carries the substrate 2 from the carrying-in stage 12 to the sticking stage 32 by sucking the substrate 2. The sticking stage 32 receives and holds the substrate 2 carried by the left transfer member 13a (FIG. 4A). After the sticking stage 32 holds the substrate 2, the sticking stage moving mechanism 33 moves the sticking stage 32 to the operation position (from the position of FIG. 4A to the position of FIG. 4B and from the position of FIG. 11A to the position of FIG. 11B) and thereby each substrate 2 is moved to the ACF sticking position and is under-received by the sticking support stand 43 (under-receiving process).

When positioning the substrate 2 in the ACF sticking position, before that, the sticking stage moving mechanism 33 actuates to move the sticking stage 32 holding the substrate 2 in the lower direction (arrow W1 in FIG. 11A), and the actuator 44 actuates to move the sticking support stand 43 in the lower direction (arrow A1 in FIG. 11A). Thus, since an interval between the sticking head 42 and the sticking support stand 43 is increased, even if the upward warpage deformation occurs in the first mounting component 3A that is already mounted on the substrate 2, the first mounting component 3A does not interfere with the sticking head 42 when positioning the substrate 2 in the ACF sticking position (from the position of FIG. 11A to the position of FIG. 11B).

Here, as illustrated in FIGS. 11A, 11B, and 11C, an upward warpage amount of a leading tip of the portion of the first mounting component 3A that is protruded from the substrate 2 tends to be large. Thus, when the first mounting component 3A passes through below the sticking head 42, if the leading tip portion of the first mounting component 3A does not interfere with the sticking head 42, the first mounting component 3A does not interfere with the sticking head 42. Thus, it is preferable in terms of tact improvement that the maximum warpage amount of the leading tip portion of the first mounting component 3A is calculated in advance in association with a material of the first mounting component 3A or the protrusion amount from the substrate 2 and the sticking support stand 43 is lowered with a minimum limit that exceeds the calculated maximum warpage amount of the first mounting component 3A.

As described above, in the embodiment, the actuator 44 has a function of lifting and lowering the sticking support stand (under-receiving section) 43 so that the first mounting component 3A does not interfere with the sticking head 42 when the substrate 2 is moved by the sticking stage moving mechanism 33 so that the substrate 2 is under-received by the sticking support stand 43.

After the substrate 2 is positioned in the ACF sticking position, the sticking stage moving mechanism 33 lifts the sticking stag 32 (in a direction of arrow W2 in FIG. 11C) and the actuator 44 lifts the sticking support stand 43 to the initial position (in a direction of arrow A2 in FIG. 11C). Thus, it becomes a state of capable of sticking in which the ACF 4 can be stuck to the substrate 2 by the ACF sticking mechanism 31. In the state of capable of sticking, the plate member 55 of the sticking head 42 mounted on a lower end of the base plate 51 presses an upward warpage portion of the first mounting component 3A (FIG. 11C). Thus, the substrate 2 is close in a flat shape by regulating the warpage deformation. As described above, in the embodiment, the plate member 55 functions as the deformation regulating member for regulating the warpage deformation upward the first mounting component 3A.

Moreover, here, after the substrate 2 is positioned in the ACF sticking position, a lifting operation of the sticking support stand 43 is started, but before the substrate 2 is positioned in the ACF sticking position to an extent that the first mounting component 3A does not interfere with the sticking head 42, the lifting operation of the sticking support stand 43 may be started. Specifically, as soon as the leading tip portion of the first mounting component 3A protruding from the substrate 2 passes through a lifting range of the sticking head 42, the actuator 44 starts the lifting operation of the sticking support stand 43. In such timing, it is possible to complete the under-receiving process at a shorter time than starting the lifting operation of the sticking support stand 43 after the substrate 2 is positioned in the ACF sticking position and it is possible to improve productivity by continuously operating the sticking support stand 43 and the sticking stage moving mechanism 33.

The timing for starting the lifting operation of the sticking support stand 43 can be determined by executing experiments, simulations, and the like by using, for example, a distance from a position in which the sticking stage 32 holds the substrate 2 to a position on which the sticking head 42 is mounted in the Y axis direction, a moving speed of the sticking stage moving mechanism 33, a length of the substrate 2 and the first mounting component 3A in the Y axis direction, and a width of the sticking head 42 in the Y axis direction.

If it becomes the state of capable of sticking, the tape transport section 52 of the sticking head 42 supplies and transports the tape member TB, and the cutter section 52c cuts the tape-shaped ACF 4 in a predetermined length by providing notches at predetermined intervals. Then, the tape transport section 52 transports the tape member TB and the sticking surface (here, the lower surface) of the ACF 4 that is cut in the predetermined length to the substrate 2 is provided to vertically face the electrode section 2d of the substrate 2 under-received by the sticking support stand 43

Figure 12A:
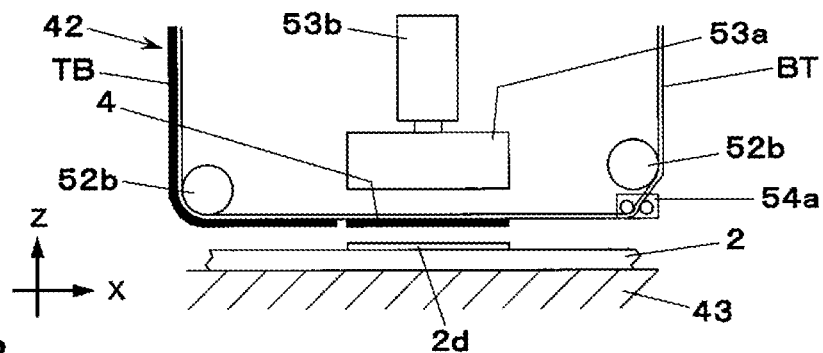
FIGS. 12A to 12D are views illustrating executing steps of the sticking operation of the ACF by the ACF sticking section included in the component mounting apparatus in the embodiment.
Figure 12B:
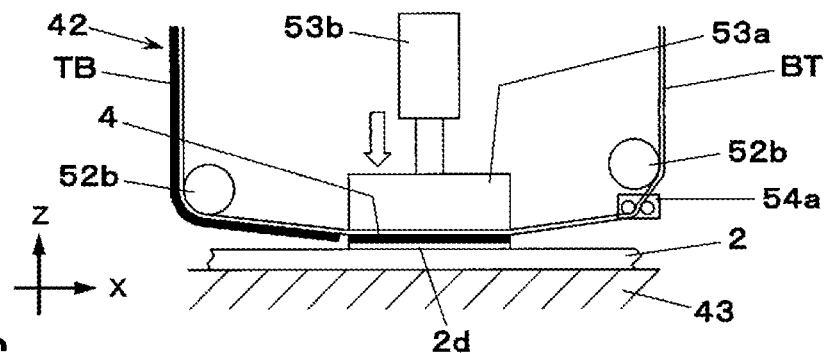

(FIG. 12A; tape transporting process). If the sticking surface of the ACF 4 to the substrate 2 vertically corresponds to the electrode section 2d of the substrate 2, the tool lifting cylinder 53b lowers the pressing tool 53a (FIG. 12B), the ACF 4 and the base tape BT are pressed to the substrate 2 by the pressing tool 53a, and the ACF 4 is stuck to the substrate 2 (pressing process).

Figure 12C:
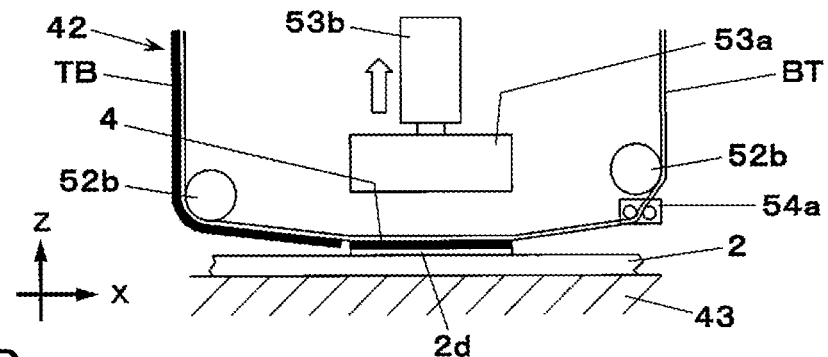
Figure 12D:
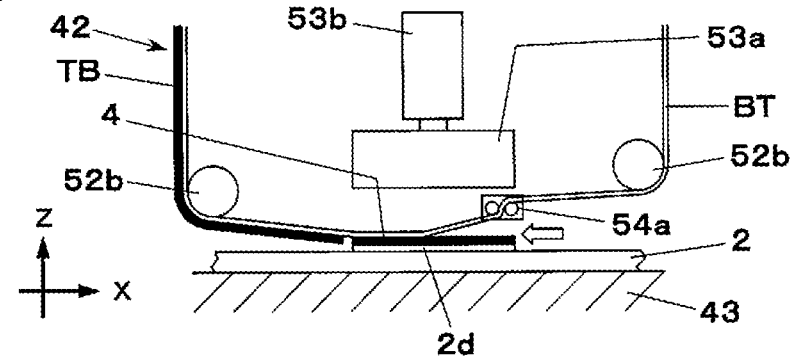

If the ACF 4 is stuck to the substrate 2, the tool lifting cylinder 53b lifts the pressing tool 53a (FIG. 12C). Then, the peeling cylinder 54b moves the peeling member 54a in the X axis direction, and the peeling member 54a is moved in the horizontal direction by interposing between the ACF 4 that is stuck to the substrate 2 (electrode section 2d) and the base tape BT. Thus, the ACF 4 that is stuck to the substrate 2 is peeled from the base tape BT (FIG. 12D; the peeling process).

During the peeling process, since the upward warpage deformation of the first mounting component 3A that is already stuck to the substrate 2 is regulated by the plate member 55, the operation of the peeling cylinder 54b is not interfered by the first mounting component 3A that is warped upward during movement of the peeling member 54a. After the ACF 4 is peeled from the base tape BT, the peeling cylinder 54b allows the peeling member 54a to return to an original position and the sticking stage moving mechanism 33 allows the sticking stage 32 to return to the substrate transfer position (FIG. 4A).

As described above, after the sticking operation of the ACF 4 to the substrate 2 in the ACF sticking mechanism 31, the center transfer member 13b sucks the substrate 2 from the sticking stage 32 and transfers the substrate 2 to the left mounting stage 63 or the right mounting stage 63. The mounting stage 63 receives and holds the substrate 2 transferred by the center transfer member 13b in the substrate transfer position (FIG. 7B). After the mounting stage 63 holds the substrate 2, the mounting stage moving mechanism 64 moves the mounting stage 63 to the operation position (FIG. 8A) and positions one substrate 2 in the component mounting position. In addition, in parallel therewith, the mounting head moving mechanism 72 moves the mounting head 73, sucks (picks up) the second mounting component 3B supplied by the component supply section 71 to the mounting head 73, and then positions the mounting head 73 above the mounting support stand 74.

Figure 13A:
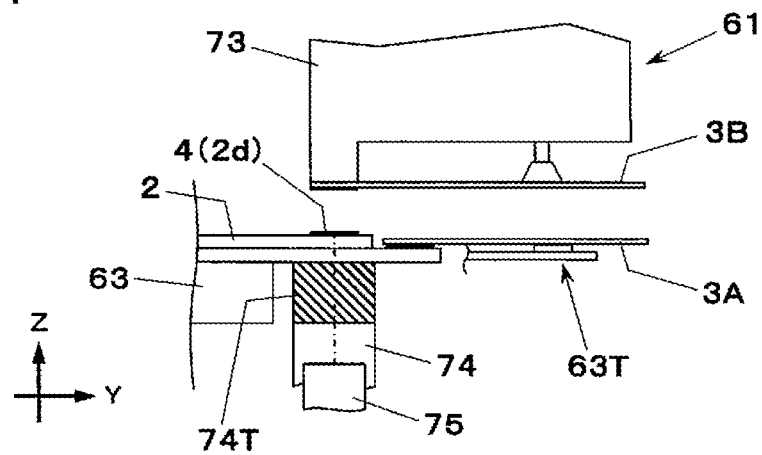
FIGS. 13A to 13C are views illustrating executing steps of a component mounting operation by the component mounting section included in the component mounting apparatus in the embodiment.
Figure 13B:
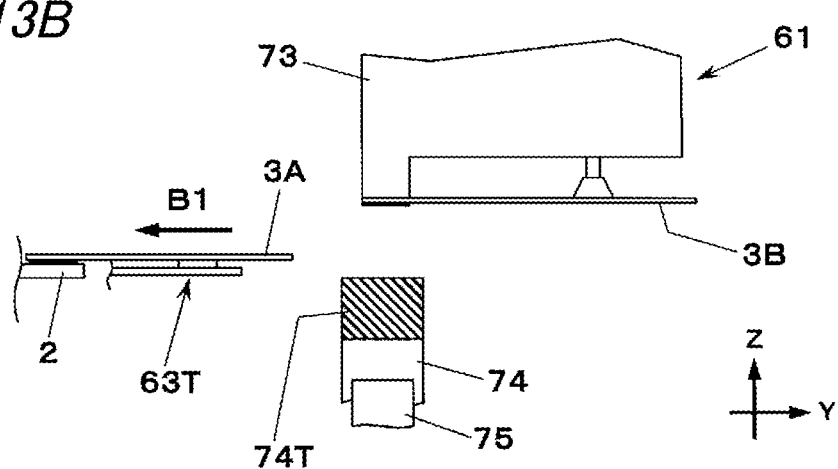

After one substrate 2 is positioned in the component mounting position, the two recognition cameras 75 recognize (image) two position recognition marks 2m (FIG. 2) provided in the substrate 2 (FIG. 13A). The control device 90 recognizes the position of the substrate 2 based on a recognition result of the two position recognition marks 2m. After the position of the substrate 2 is recognized, the mounting stage moving mechanism 64 moves the mounting stage 63 forward and retracts once the electrode section 2d from an upper position of the mounting support stand 74 (FIG. 13B; an arrow B1 indicated in the view).

Figure 13C:
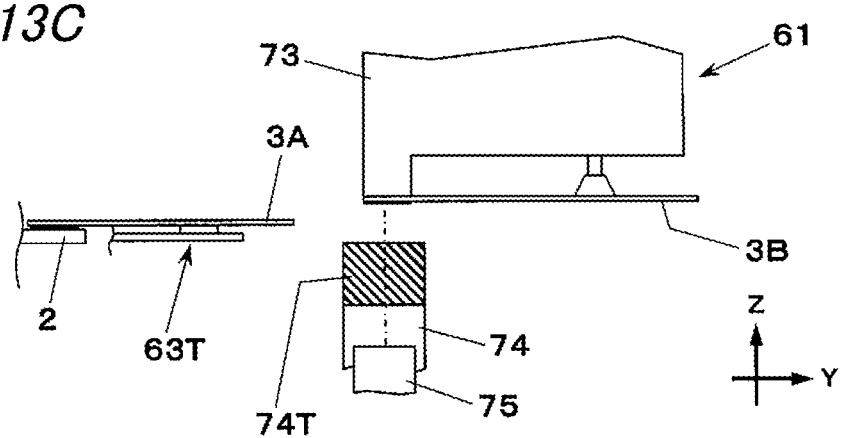
Figure 14A:
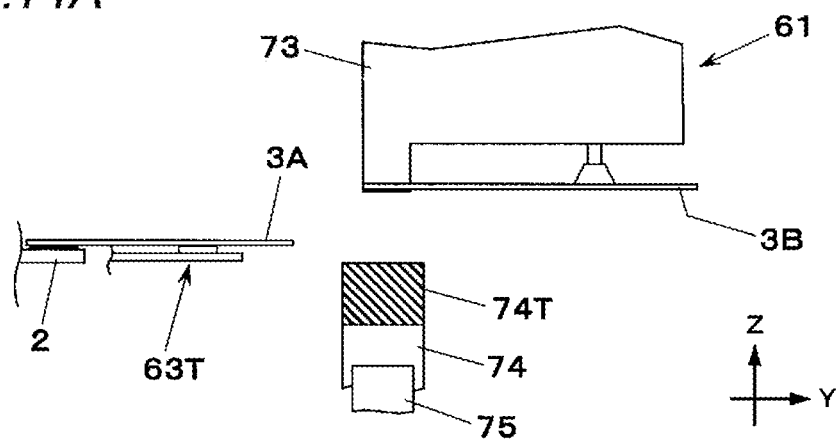
FIGS. 14A to 14C are views illustrating executing steps of the component mounting operation by the component mounting section included in the component mounting apparatus in the embodiment.
Figure 14B:
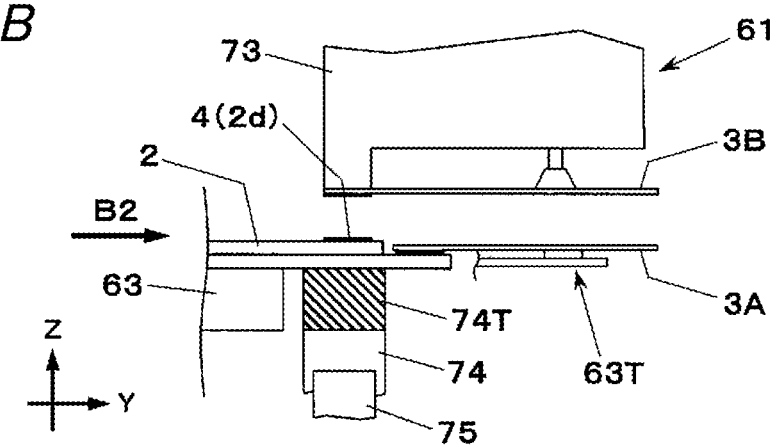

After the mounting stage moving mechanism 64 retracts the mounting stage 63 forward, the mounting head moving mechanism 72 lowers the mounting head 73 and the two recognition cameras 75 recognize the two position recognition marks (not illustrated) provided in the second mounting component 3B (FIG. 13C). The control device 90 calculates the position of the second mounting component 3B based on the recognition result of the two position recognition marks. After the position of the second mounting component 3B is calculated, the mounting head moving mechanism 72 lifts the mounting head 73 (FIG. 14A). Then, the mounting stage moving mechanism 64 positions the substrate 2 in the component mounting position by moving the mounting stage 63 in the operation position again (arrow B2 indicated in FIG. 14B) and moves the mounting stage 63 based on a relationship between the position of the substrate 2 that is already calculated and the position of the second mounting component 3B, and then positioning of the substrate 2 with respect to the second mounting component 3B is performed (FIG. 14B).

Figure 14C:
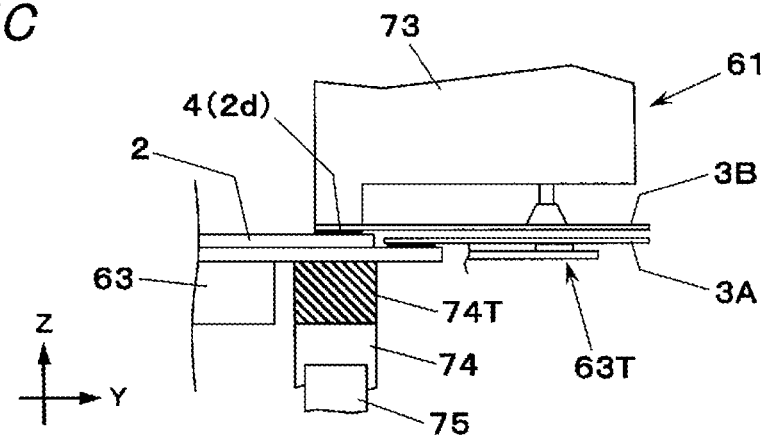

After positioning of the substrate 2 with respect to the second mounting component 3B, the mounting head moving mechanism 72 lowers the mounting head 73 and presses the second mounting component 3B that is stuck by the mounting head 73 to the ACF 4 on the substrate 2 (FIGS. 8B and 14C). In this case, a pressing force of the mounting head 73 is supported by the mounting support stand 74. Thus, the second mounting component 3B is mounted on the substrate 2. After the second mounting component 3B is mounted on the substrate 2, the mounting head moving mechanism 72 lifts the mounting head 73.

After the second mounting component 3B is mounted on one substrate 2, the mounting stage moving mechanism 64 moves (moves in the component mounting position) the mounting stage 63 in the X axis direction, positions another substrate 2 in the component mounting position, and the mounting head 73 mounts the second mounting component 3B on the substrate 2. After the second mounting component 3B is mounted on two substrates, the mounting head moving mechanism 72 lifts the mounting head 73.

Figure 15A:
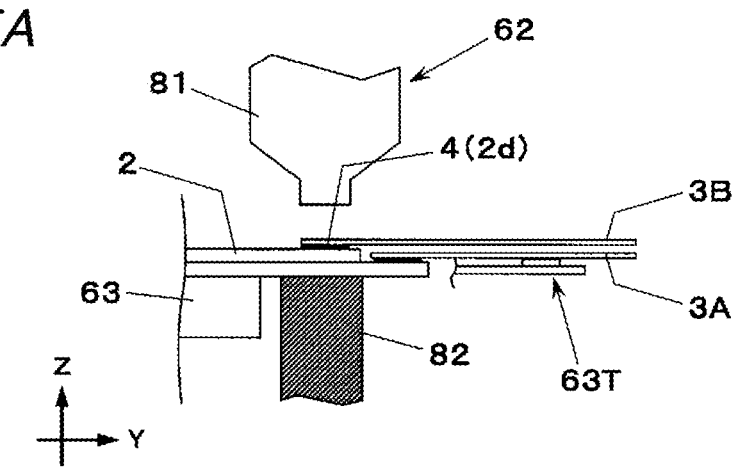
FIGS. 15A to 15C are views illustrating executing steps of a component pressing operation by a component mounting section included in the component mounting apparatus in the embodiment.

As described above, after the mounting operation of the second mounting component 3B on the substrate 2 in the component mounting mechanism 61 is completed, the mounting stage moving mechanism 64 moves the mounting stage 63 in the X axis direction and positions each substrate 2 in the component pressing position (FIGS. 9A and 15A).

Figure 15B:
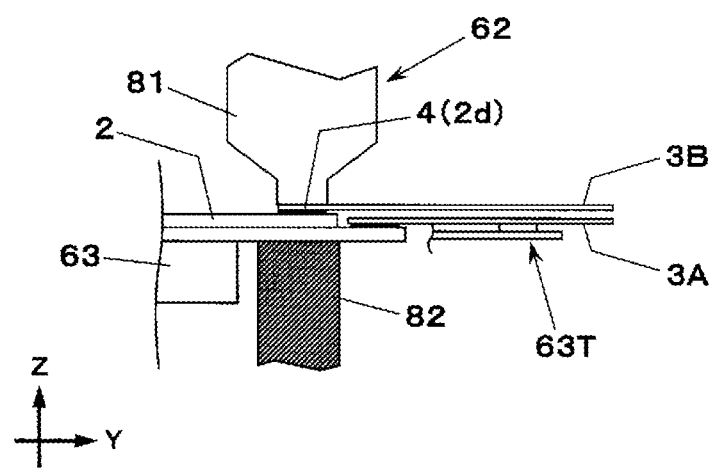
Figure 15C:
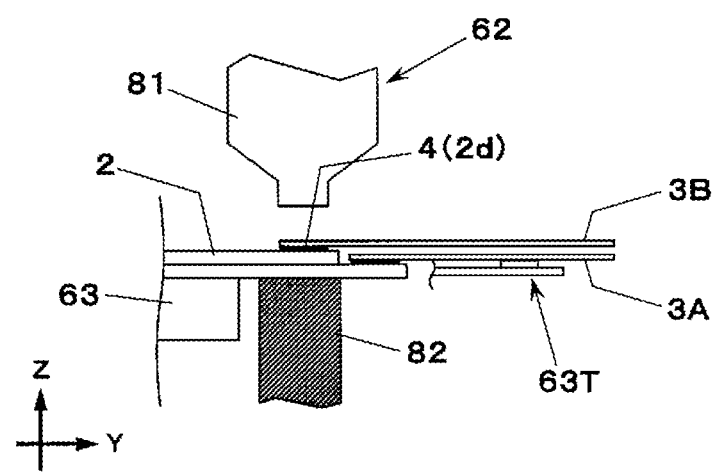

After the electrode section 2d of the substrate 2 is positioned below the pressing head 81, the component pressing mechanism 62 lowers the pressing head 81 and presses the second mounting component 3B mounted on the substrate 2 to the pressing support stand 82 together with the substrate 2 (from the position of FIG. 15A to the position of FIG. 15B). Thus, the second mounting component 3B is pressed to the substrate 2. After the second mounting component 3B is pressed to the substrate 2, the component pressing mechanism 62 lifts the pressing head 81 (from the position of FIG. 15B to the position of FIG. 15C) and the mounting stage moving mechanism 64 allows the mounting stage 63 to return to the substrate transfer position (FIG. 9B).

As described above, after the pressing operation of the component to the substrate 2 in the component mounting section 15 is completed, the right transfer member 13c sucks the substrate 2 from the mounting stage 63 and transfers the substrate 2 to the carrying-out stage 16. The carrying-out stage 16 receives and holds the substrate 2 transferred by the right transfer member 13c. The substrate 2 transferred by the carrying-out stage 16 is carried out to another device on the downstream process side of the component mounting apparatus 1 by a substrate carrying-out unit (not illustrated).

As described above, in the component mounting apparatus 1 (component mounting method) in the embodiment, when the substrate 2 is moved so that the substrate 2 is under-received by the sticking support stand 43 (under-receiving section), the sticking support stand 43 is lifted and lowered by the under-receiving section lifting unit (actuator 44) so that the film-shaped component (first mounting component 3A) that is already mounted on the substrate 2 does not interfere with the sticking head 42. Thereby, the clearance between the sticking head 42 and the sticking support stand 43 is expanded. Accordingly, even when an upward warpage deformation is generated in the first mounting component 3A, the substrate 2 can be surely under-received by the sticking support stand 43. In addition, since the upward warpage deformation of the first mounting component 3A is regulated during moving the peeling member 54a, the peeling member 54a does not interfere with the first mounting component 3A and the peeling member 54a can reliably peel the ACF 4 from the base tape BT. That is, even if the warpage deformation occurs in the first mounting component 3A that is mounted on the substrate 2, workability is not lowered.

In accordance with the above embodiment, the sticking support stand 43 is lifted or lowered by the actuator 44 to expand the clearance between the sticking head 42 and sticking support stand 43 so that the first mounting component 3A that is already mounted on the substrate 2 does not interfere with the sticking head 42 when the substrate 2 is moved so as to be under-received by the sticking support stand 43.

In accordance with a modified embodiment described in the below, the sticking head 42 is lifted or lowered by a sticking head lifting unit 44 to expand the clearance between the sticking head 42 and sticking support stand 43 so that the first mounting component 3A that is already mounted on the substrate 2 does not interfere with the sticking head 42 when the substrate 2 is moved so as to be under-received by the sticking support stand 43. Further, descriptions which would be duplicated with the above embodiment may be omitted in the below description for the modified embodiment.

In the modified embodiment, the sticking head 42 is mounted on the head support section 41 via a sticking head lifting unit 44 provided in the head support section 41. In the modified embodiment, the sticking head lifting unit 44 is configured of a ball screw 44N screwed to a screw groove (not illustrated) formed in a rear portion of the sticking head 42 and a sticking head lifting motor 44M that drives the ball screw 44N to be rotated (FIGS. 16, 17A, and 17B).

Figure 16:
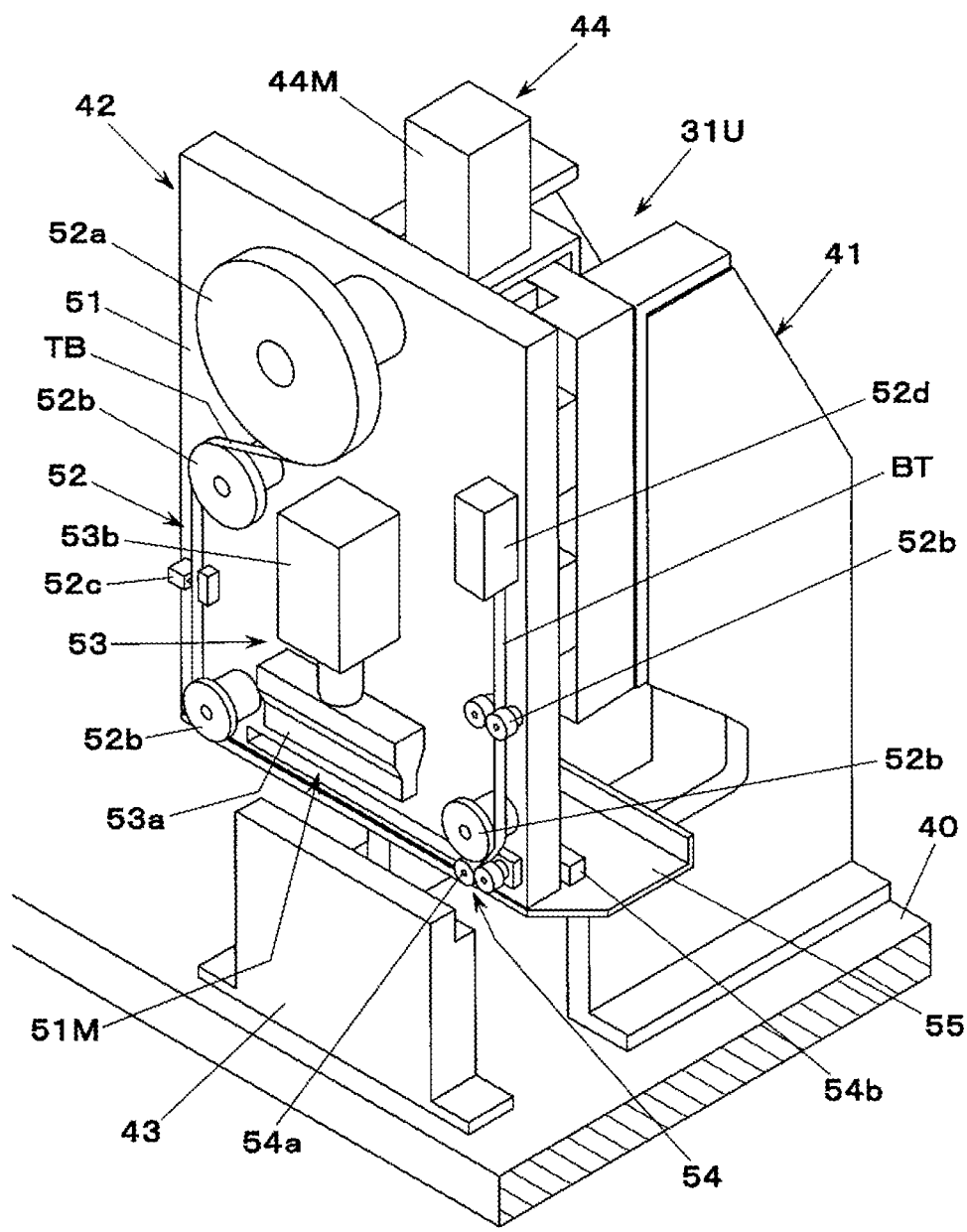
FIG. 16 is a partial perspective view of an ACF sticking section included in a component mounting apparatus in a modified embodiment.

In FIGS. 16, 17A, and 17B, the pressing section 53 is configured of a pressing tool 53a and a tool lifting cylinder 53b for lifting and lowering the pressing tool 53a. The peeling section 54 includes a peeling member 54a with which the tape member TB (specifically, the base tape BT) transported by the tape transport section 52 is interposed between a pair of rollers and a peeling cylinder 54b that moves the peeling member 54a along a moving groove 51M provided in a lower portion of the base plate 51 in the X axis direction. The sticking head lifting motor 44M lifts and lowers the sticking head 42 with respect to the head support section 41 (that is, with respect to the base stand 11) by driving the ball screw 44N to be rotated. FIG. 17A illustrates a state where the sticking head 42 is positioned in a usual position (referred to as an initial position) and FIG. 17B illustrates a state where the sticking head 42 is lifted from the initial position. The plate member 55 is mounted on a lower end of the base plate 51. The plate member 55 extends rearward the base plate 51.

Figure 18A:
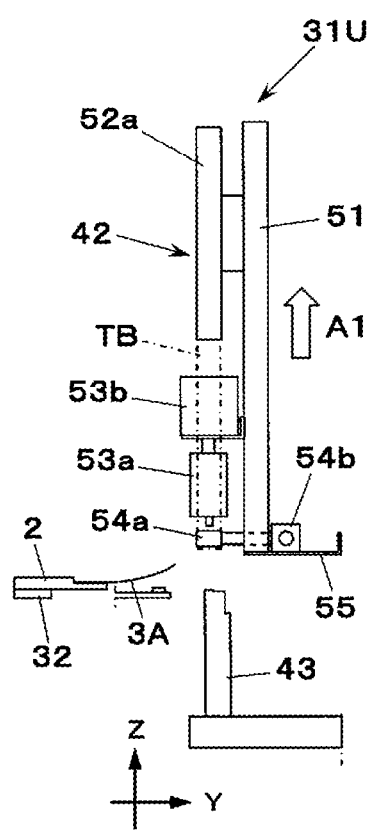
FIGS. 18A to 18C are explanatory views of an operation during a sticking operation of an ACF by the ACF sticking section included in the component mounting apparatus in the modified embodiment.

When positioning the substrate 2 in the ACF sticking position, before that, the sticking head lifting motor 44M is operated and then the sticking head 42 is lifted (arrow A1 indicated in FIG. 18A). Thus, since an interval between the sticking head 42 and the sticking support stand 43 is increased, even if the upward warpage deformation occurs in the first mounting component 3A that is already mounted on the substrate 2, the first mounting component 3A does not interfere with the sticking head 42 when positioning the substrate 2 in the ACF sticking position (from the position of FIG. 18A to the position of FIG. 18B).

Figure 18B:
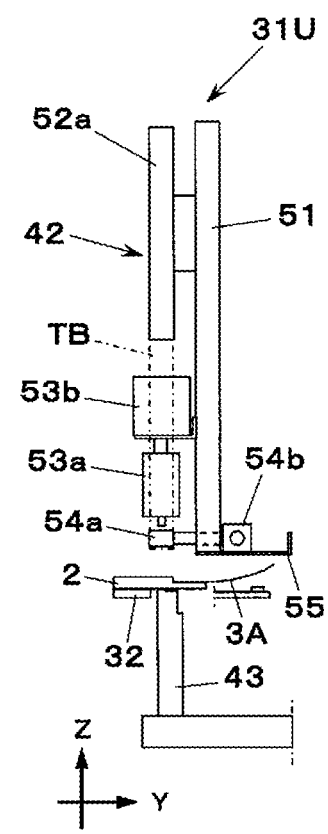
Figure 18C:
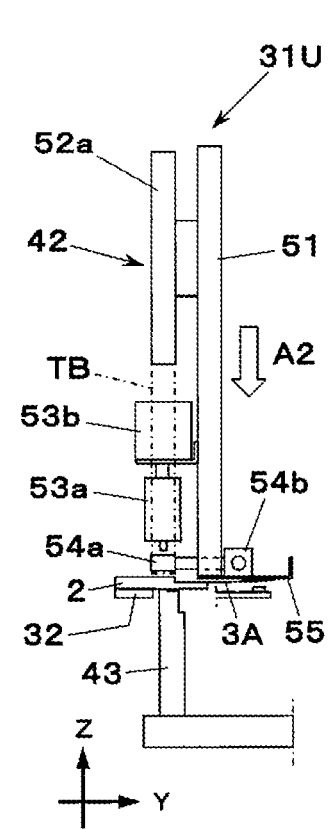

Here, as illustrated in FIGS. 18A, 18B, and 18C, an upward warpage amount of a leading tip of the portion of the first mounting component 3A that is protruded from the substrate 2 tends to be large. Thus, when the first mounting component 3A passes through below the sticking head 42, if the leading tip portion of the first mounting component 3A does not interfere with the sticking head 42, the first mounting component 3A does not interfere with the sticking head 42. Thus, it is preferable in terms of tact improvement that the maximum warpage amount of the leading tip portion of the first mounting component 3A is calculated in advance in association with a material of the first mounting component 3A or the protrusion amount from the substrate 2 and the sticking head 42 is lifted with a minimum limit that exceeds the calculated maximum warpage amount of the first mounting component 3A.

As described above, in the modified embodiment, the sticking head lifting unit 44 configured of the sticking head lifting motor 44M and the ball screw 44N has a function of lifting and lowering the sticking head 42 so that the first mounting component 3A does not interfere with the sticking head 42 when the sticking head lifting unit 44 is moved by the sticking stage moving mechanism 33 so as to under-receive the substrate 2 by the sticking support stand 43.

After the substrate 2 is positioned in the ACF sticking position, the sticking head lifting motor 44M lowers the sticking head 42 to the initial position (arrow A2 indicated in FIG. 18C). Thus, it becomes a state of capable of sticking in which the ACF 4 can be stuck to the substrate 2 by the ACF sticking mechanism 31. In the state of capable of sticking, the plate member 55 of the sticking head 42 mounted on a lower end of the base plate 51 presses an upward warpage portion of the first mounting component 3A (FIG. 18C). Thus, the substrate 2 is close in a flat shape by regulating the warpage deformation. As described above, in the embodiment, the plate member 55 functions as the deformation regulating member for regulating the warpage deformation upward the first mounting component 3A.

Moreover, here, after the substrate 2 is positioned in the ACF sticking position, a lowering operation of the sticking head 42 is started, but before the substrate 2 is positioned in the ACF sticking position to an extent that the first mounting component 3A does not interfere with the sticking head 42, the lowering operation of the sticking head 42 may be started. Specifically, as soon as the leading tip portion of the first mounting component 3A protruding from the substrate 2 passes through a lifting range of the sticking head 42, the sticking head lifting motor 44M starts the lowering operation of the sticking head 42. In such timing, it is possible to complete the under-receiving process at a shorter time than starting the lowering operation of the sticking head 42 after the substrate 2 is positioned in the ACF sticking position and it is possible to improve productivity by continuously operating the sticking head 42 and the sticking stage moving mechanism 33.

As described above, in the component mounting apparatus 1 (component mounting method) in the exemplary embodiment, when the substrate 2 is moved so that the substrate 2 is under-received by the sticking support stand 43 (under-receiving section), the sticking head 42 is lifted and lowered by the sticking head lifting unit 44 so that the film-shaped component (first mounting component 3A) that is already mounted on the substrate 2 does not interfere with the sticking head 42. Thereby, the clearance between the sticking head 42 and the sticking support stand 43 is expanded. Accordingly, even when there is an upward warpage deformation in the first mounting component 3A, the substrate 2 can be surely under-received by the sticking support stand 43. In addition, since the upward warpage deformation of the first mounting component 3A is regulated during moving the peeling member 54a, the peeling member 54a does not interfere with the first mounting component 3A and the peeling member 54a can reliably peel the ACF 4 from the base tape BT. That is, even if the warpage deformation occurs in the first mounting component 3A that is mounted on the substrate 2, workability is not lowered.

According to the method and apparatus of the embodiments, workability is not lowered even if the warpage deformation occurs in the film-shaped component that is already mounted on the substrate.

In accordance with one or more embodiments, an Anisotropic Conductive Film (ACF) is stuck to a substrate by:

under-receiving the substrate on which a film-shaped component is mounted by a under-receiving section;

transporting a tape member that is obtained by bonding a base tape to the ACF by a tape transport section included in a sticking head and causing a sticking surface of the ACF to the substrate to face the substrate under-received by the under-receiving section;

pressing the ACF together with the base tape on the substrate by a pressing tool included in the sticking head and sticking the ACF to the substrate on which the film-shaped component is mounted;

peeling the ACF sticking to the substrate from the base tape by moving a peeling member in a horizontal direction by causing the peeling member to be interposed between the ACF sticking to the substrate and the base tape;

increasing an interval between the sticking head and the under-receiving section, during the under-receiving the substrate on the under-receiving section by moving the substrate on which the film-shaped component is mounted; and regulating an upward warpage deformation of the component during peeling the ACF from the base tape by moving the peeling member.

In accordance with one or more embodiments, an Anisotropic Conductive Film (ACF) sticking apparatus is provided with:

an under-receiving section that under-receives the substrate on which a film-shaped component is mounted;

a substrate holding section that holds the substrate;

a substrate moving section that moves the substrate holding section so that the substrate held by the substrate holding section is under-received by the under-receiving section;

a sticking head that is positioned above the under-receiving section and sticks the ACF to the substrate under-received by the under-receiving section; and an interval changing unit that increase an interval between the sticking head and the under-receiving section when the substrate moving section moves the substrate so that the substrate is under-received by the under-receiving section.

In the apparatus, the sticking head is provided with:

a tape transport section that transports a tape member in which a base tape is bonded to the ACF and causes a sticking surface of the ACF to the substrate to face the substrate under-received by the under-receiving section;

a pressing tool that presses the ACF together with the base tape on the substrate, and sticks the ACF to the substrate on which the film-shaped component is mounted;

a peeling member that peels the ACF sticking to the substrate from the base tape, wherein the peeling member is configured to interpose between the ACF sticking to the substrate and the base tap and move in a horizontal direction to peel the ACF from the base tape; and a deformation regulating member that regulates an upward warpage deformation of the component during moving the peeling member.

The interval changing unit may include an under-receiving section lifting unit that moves up and down the under-receiving section so that the film-shaped component does not interfere with the sticking head.

The interval changing unit may include a sticking head lifting unit that moves up and down the sticking head so that the film-shaped component does not interfere with the sticking head.

The sticking head lifting unit may lift the sticking head so that the film-shaped component does not interfere with the sticking head when the substrate moving section moves the substrate so that the substrate is under-received by the under-receiving section, and the sticking head lifting unit may lower the sticking head after the film-shaped component passes through a lifting range of the sticking head.

According to the method and apparatus of the embodiments, workability is not lowered even if the warpage deformation occurs in the film-shaped component that is already mounted on the substrate.

DESCRIPTION OF REFERENCE NUMERALS AND SIGNS 2 substrate
3A first mounting component (component)
4 ACF
14 ACF sticking section (ACF sticking apparatus)
32 sticking stage (substrate holding section)
33 sticking stage moving mechanism (substrate moving section)
42 sticking head
43 sticking support stand (under-receiving section)
44 actuator (under-receiving section lifting unit)
52 tape transport section
53a pressing tool
54a peeling member
55 plate member (deformation regulating member)
BT base tape
TB tape member

What is claimed is:
1. An Anisotropic Conductive Film (ACF) sticking method for sticking an ACF to a substrate, the method comprising:
under-receiving the substrate on which a film-shaped component is mounted by a under-receiving section;
transporting a tape member that is obtained by bonding a base tape to the ACF by a tape transport section included in a sticking head and causing a sticking surface of the ACF to the substrate to face the substrate under-received by the under-receiving section;
calculating a maximum warpage amount of the component and lowering the under-receiving section with a distance exceeding the maximum warpage amount of the component;
pressing the ACF together with the base tape on the substrate by a pressing tool included in the sticking head and sticking the ACF to the substrate on which the film-shaped component is mounted;
peeling the ACF sticking to the substrate from the base tape by moving a peeling member in a horizontal direction by causing the peeling member to be interposed between the ACF sticking to the substrate and the base tape;

increasing an interval between the sticking head and the under-receiving section, during the under-receiving the substrate on the under-receiving section by moving the substrate on which the film-shaped component is mounted; and regulating an upward warpage deformation of the component during peeling the ACF from the base tape by moving the peeling member.

2. The method according to claim 1, further comprising:

moving up and down the under-receiving section so that the film-shaped component does not interfere with the sticking head, during the under-receiving the substrate on the under-receiving section by moving the substrate on which the film-shaped component is mounted.

3. The method according to claim 1, further comprising:

moving up and down the sticking head so that the film-shaped component does not interfere with the sticking head, during the under-receiving the substrate on the under-receiving section by moving the substrate on which the film-shaped component is mounted.

4. The method according to claim 3, further comprising:

lifting the sticking head so that the film-shaped component does not interfere with the sticking head, during the under-receiving the substrate on the under-receiving section by moving the substrate on which the film-shaped component is mounted; and lowering the sticking head after the film-shaped component passes through a lifting range of the sticking head.

\* \* \* \* \*